(12) United States Patent
Yamauchi

(10) Patent No.: US 7,041,544 B2
(45) Date of Patent: May 9, 2006

(54) SEMICONDUCTOR INTEGRATED CIRCUIT AND METHOD FOR FABRICATING THE SAME

(75) Inventor: Hiroyuki Yamauchi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 113 days.

(21) Appl. No.: 10/887,805

(22) Filed: Jul. 12, 2004

(65) Prior Publication Data

US 2004/0246787 A1    Dec. 9, 2004

Related U.S. Application Data

(62) Division of application No. 10/445,807, filed on May 28, 2003, now Pat. No. 6,770,940.

(30) Foreign Application Priority Data

Jun. 5, 2002 (JP) .............................. 2002-163854

(51) Int. Cl.
*H01L 21/8238* (2006.01)

(52) U.S. Cl. ...................... 438/199; 438/199; 438/200

(58) Field of Classification Search ................. 438/199

See application file for complete search history.

(56) References Cited

U.S. PATENT DOCUMENTS

| 5,285,069 | A | * | 2/1994 | Kaibara et al. | ............. 257/392 |
| 6,424,015 | B1 | | 7/2002 | Ishibashi et al. | |
| 6,436,753 | B1 | * | 8/2002 | Ikeda et al. | ................. 438/238 |
| 6,563,180 | B1 | * | 5/2003 | Ishibashi et al. | ............ 257/391 |
| 2001/0038552 | A1 | | 11/2001 | Ishimaru | |
| 2003/0227060 | A1 | | 12/2003 | Yamauchi | |

* cited by examiner

*Primary Examiner*—George Eckert
*Assistant Examiner*—Bac H. Au
(74) *Attorney, Agent, or Firm*—McDermott Will & Emery LLP

(57) ABSTRACT

First to third logic circuits and first to third static random access memories (SRAMs) are formed on one chip. Power to the first and third logic circuits and their SRAMs is shut off as required, while power to the second logic circuit and its SRAM is kept supplied. The third SRAM has the largest memory capacity. The average channel width of the first to third SRAM cell arrays is set at a half or less of that of the other circuit blocks, and the channel impurity concentration of the second and third SRAM cell arrays, which operate at low speed, is set higher than that of the first SRAM cell array, which operates at high speed, by additional ion implantation. By these settings, MOS transistors of low threshold voltage (Vt) are provided for the first SRAM cell array, while MOS transistors of high Vt are provided for the second and third SRAM cell arrays for leakage reduction.

2 Claims, 24 Drawing Sheets

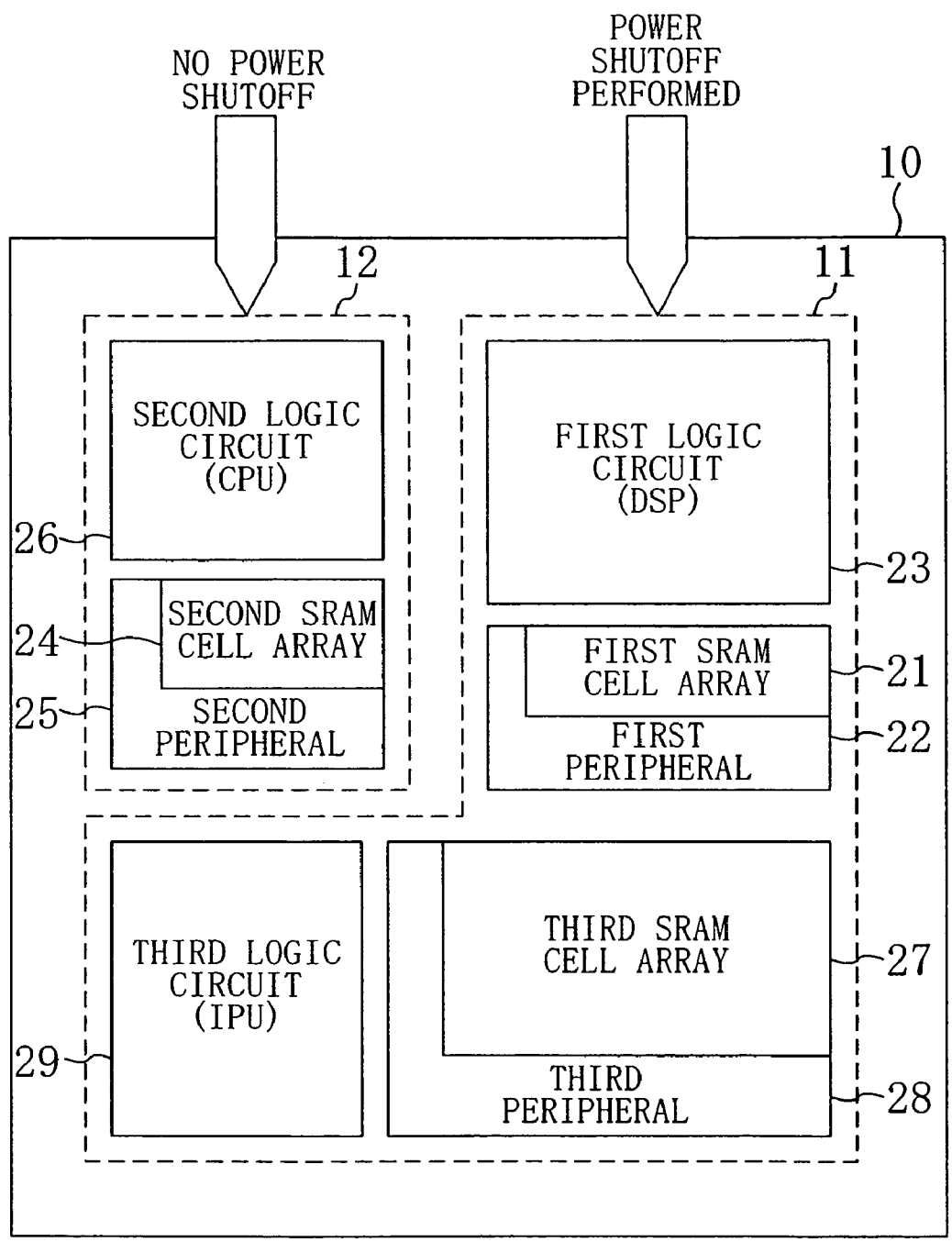

FIG. 2A  21, 24, 27
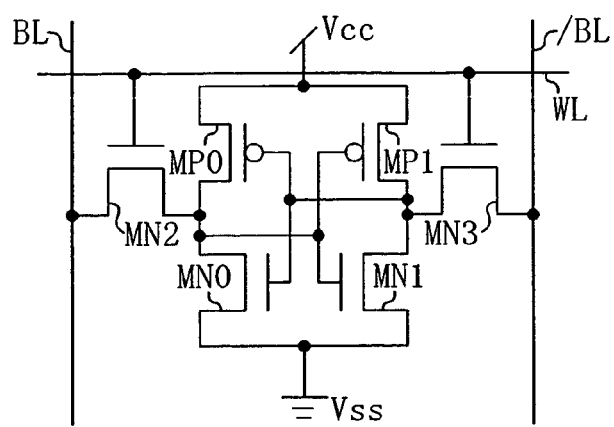
FIG. 2B  22, 25, 28
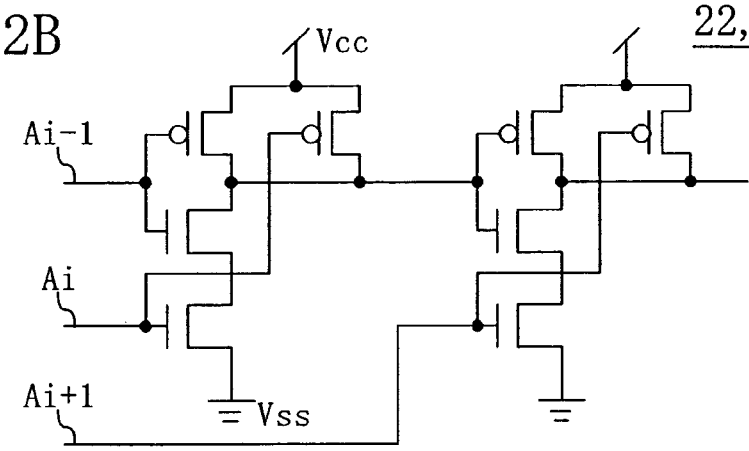
FIG. 2C  23, 26, 29
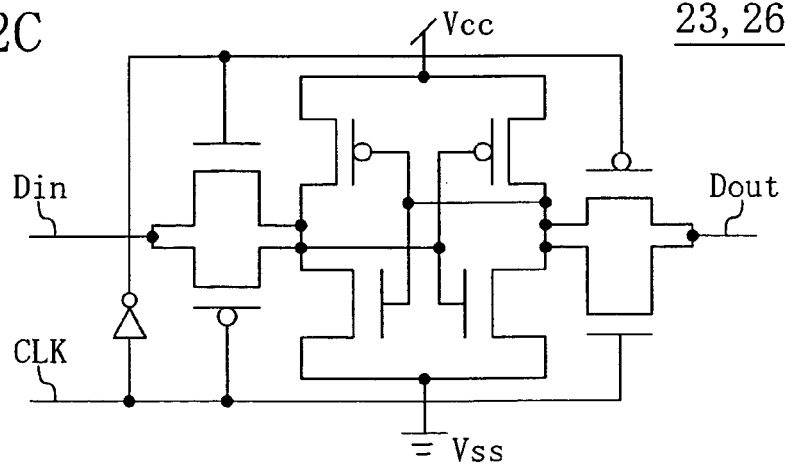

FIG. 3

| | OPERATING FREQUENCY (CYCLE TIME) | CAPACITY | DEGREE OF NECESSITY OF LEAKAGE REDUCTION DURING OPERATION | DEGREE OF NECESSITY OF LEAKAGE REDUCTION DURING STANDBY | POWER SHUTOFF |
|---|---|---|---|---|---|
| FIRST SRAM | 250MHz (4ns) | 100 KBITS | SMALL | SMALL | PERMITTED |
| SECOND SRAM | 100MHz (10ns) | 100 KBITS | SMALL | LARGE | NOT PERMITTED |
| THIRD SRAM | 33MHz (30ns) | >500 KBITS | LARGE | SMALL | PERMITTED |

FIG. 4

| | | IMPURITY CONCENTRATION | AVERAGE CHANNEL WIDTH ($\mu m$) | AVERAGE THRESHOLD VOLTAGE (V) | ADDITIONAL ION IMPLANTATION PERFORMED? | POWER SHUTOFF PERFORMED? |
|---|---|---|---|---|---|---|
| BLOCK 21 | N-CHANNEL | n1 | <0.3 | 0.30 | NO | YES |
| | P-CHANNEL | n2 | <0.3 | -0.35 | NO | YES |
| BLOCK 22 | N-CHANNEL | n1 | >0.6 | 0.40 | NO | YES |
| | P-CHANNEL | n2 | >0.6 | -0.40 | NO | YES |
| BLOCK 23 | N-CHANNEL | n1 | >0.6 | 0.40 | NO | YES |
| | P-CHANNEL | n2 | >0.6 | -0.40 | NO | YES |
| BLOCK 24 | N-CHANNEL | n3 | <0.3 | 0.40 | YES | NO |
| | P-CHANNEL | n4 | <0.3 | -0.40 | YES | NO |
| BLOCK 25 | N-CHANNEL | n1 | >0.6 | 0.40 | NO | NO (YES) |
| | P-CHANNEL | n2 | >0.6 | -0.40 | NO | NO (YES) |
| BLOCK 26 | N-CHANNEL | n1 | >0.6 | 0.40 | NO | NO |
| | P-CHANNEL | n2 | >0.6 | -0.40 | NO | NO |
| BLOCK 27 | N-CHANNEL | n3 | <0.3 | 0.40 | YES | YES |
| | P-CHANNEL | n4 | <0.3 | -0.40 | YES | YES |
| BLOCK 28 | N-CHANNEL | n1 | >0.6 | 0.40 | NO | YES |
| | P-CHANNEL | n2 | >0.6 | -0.40 | NO | YES |
| BLOCK 29 | N-CHANNEL | n1 | >0.6 | 0.40 | NO | YES |
| | P-CHANNEL | n2 | >0.6 | -0.40 | NO | YES |

FIG. 6

| | | IMPURITY CONCENTRATION | AVERAGE CHANNEL WIDTH ($\mu m$) | AVERAGE THRESHOLD VOLTAGE (V) | ADDITIONAL ION IMPLANTATION PERFORMED? | POWER SHUTOFF PERFORMED? |
|---|---|---|---|---|---|---|
| BLOCK 21 | N-CHANNEL | n1 | <0.3 | 0.30 | NO | YES |
| | P-CHANNEL | n2 | <0.3 | -0.35 | NO | YES |
| BLOCK 22 | N-CHANNEL | n1 | >0.6 | 0.40 | NO | YES |
| | P-CHANNEL | n2 | >0.6 | -0.40 | NO | YES |
| BLOCK 23 | N-CHANNEL | n1 | >0.6 | 0.40 | NO | YES |
| | P-CHANNEL | n2 | >0.6 | -0.40 | NO | YES |
| BLOCK 24 | N-CHANNEL | n3 | <0.3 | 0.40 | YES | NO |
| | P-CHANNEL | n2 | <0.3 | -0.35 | NO | NO |
| BLOCK 25 | N-CHANNEL | n1 | >0.6 | 0.40 | NO | NO (YES) |
| | P-CHANNEL | n2 | >0.6 | -0.40 | NO | NO (YES) |
| BLOCK 26 | N-CHANNEL | n1 | >0.6 | 0.40 | NO | NO |
| | P-CHANNEL | n2 | >0.6 | -0.40 | NO | NO |
| BLOCK 27 | N-CHANNEL | n3 | <0.3 | 0.40 | YES | YES |
| | P-CHANNEL | n2 | <0.3 | -0.35 | NO | YES |
| BLOCK 28 | N-CHANNEL | n1 | >0.6 | 0.40 | NO | YES |
| | P-CHANNEL | n2 | >0.6 | -0.40 | NO | YES |
| BLOCK 29 | N-CHANNEL | n1 | >0.6 | 0.40 | NO | YES |
| | P-CHANNEL | n2 | >0.6 | -0.40 | NO | YES |

FIG. 7

| | | IMPURITY CONCENTRATION | AVERAGE CHANNEL WIDTH ($\mu m$) | AVERAGE THRESHOLD VOLTAGE (V) | ADDITIONAL ION IMPLANTATION PERFORMED? | POWER SHUTOFF PERFORMED? |
|---|---|---|---|---|---|---|
| BLOCK 21 | N-CHANNEL | n1 | <0.3 | 0.30 | NO | YES |
| | P-CHANNEL | n2 | <0.3 | -0.35 | NO | YES |
| BLOCK 22 | N-CHANNEL | n1 | >0.6 | 0.40 | NO | YES |
| | P-CHANNEL | n2 | >0.6 | -0.40 | NO | YES |
| BLOCK 23 | N-CHANNEL | n1 | >0.6 | 0.40 | NO | YES |
| | P-CHANNEL | n2 | >0.6 | -0.40 | NO | YES |
| BLOCK 24 | N-CHANNEL | n3 | <0.3 | 0.40 | YES | NO |
| | P-CHANNEL | n4 | <0.3 | -0.40 | YES | NO |
| BLOCK 25 | N-CHANNEL | n3 | >0.6 | 0.45 | YES | NO(YES) |
| | P-CHANNEL | n4 | >0.6 | -0.45 | YES | NO(YES) |
| BLOCK 26 | N-CHANNEL | n3 | >0.6 | 0.45 | YES | NO |
| | P-CHANNEL | n4 | >0.6 | -0.45 | YES | YES |
| BLOCK 27 | N-CHANNEL | n3 | <0.3 | 0.40 | YES | YES |
| | P-CHANNEL | n4 | <0.3 | -0.40 | YES | YES |
| BLOCK 28 | N-CHANNEL | n3 | >0.6 | 0.45 | YES | YES |
| | P-CHANNEL | n4 | >0.6 | -0.45 | YES | YES |
| BLOCK 29 | N-CHANNEL | n3 | >0.6 | 0.45 | YES | YES |
| | P-CHANNEL | n4 | >0.6 | -0.45 | YES | YES |

FIG. 8

|  |  | IMPURITY CONCENTRATION | AVERAGE CHANNEL WIDTH (μm) | AVERAGE THRESHOLD VOLTAGE (V) | ADDITIONAL ION IMPLANTATION PERFORMED? | POWER SHUTOFF PERFORMED? |
|---|---|---|---|---|---|---|
| BLOCK 21 | N-CHANNEL | n1 | <0.3 | 0.30 | NO | YES |
|  | P-CHANNEL | n2 | <0.3 | -0.35 | NO | YES |
| BLOCK 22 | N-CHANNEL | n1 | >0.6 | 0.40 | NO | YES |
|  | P-CHANNEL | n2 | >0.6 | -0.40 | NO | YES |
| BLOCK 23 | N-CHANNEL | n1 | >0.6 | 0.40 | NO | YES |
|  | P-CHANNEL | n2 | >0.6 | -0.40 | NO | YES |
| BLOCK 24 | N-CHANNEL | n3 | <0.3 | 0.40 | YES | NO |
|  | P-CHANNEL | n2 | <0.3 | -0.35 | NO | NO |
| BLOCK 25 | N-CHANNEL | n3 | >0.6 | 0.45 | YES | NO (YES) |
|  | P-CHANNEL | n2 | >0.6 | -0.40 | NO | NO (YES) |
| BLOCK 26 | N-CHANNEL | n3 | >0.6 | 0.45 | YES | NO |
|  | P-CHANNEL | n2 | >0.6 | -0.40 | NO | NO |
| BLOCK 27 | N-CHANNEL | n3 | <0.3 | 0.40 | YES | YES |
|  | P-CHANNEL | n2 | <0.3 | -0.35 | NO | YES |
| BLOCK 28 | N-CHANNEL | n3 | >0.6 | 0.45 | YES | YES |
|  | P-CHANNEL | n2 | >0.6 | -0.40 | NO | YES |
| BLOCK 29 | N-CHANNEL | n3 | >0.6 | 0.45 | YES | YES |
|  | P-CHANNEL | n2 | >0.6 | -0.40 | NO | YES |

FIG. 9

| | | IMPURITY CONCENTRATION | AVERAGE CHANNEL WIDTH ($\mu$m) | AVERAGE THRESHOLD VOLTAGE (V) | ADDITIONAL ION IMPLANTATION PERFORMED? | POWER SHUTOFF PERFORMED? |
|---|---|---|---|---|---|---|
| BLOCK 21 | N-CHANNEL | n1 | <0.3 | 0.30 | NO | YES |
| | P-CHANNEL | n2 | <0.3 | -0.35 | NO | YES |
| BLOCK 22 | N-CHANNEL | n1 | >0.6 | 0.40 | NO | YES |
| | P-CHANNEL | n2 | >0.6 | -0.40 | NO | YES |
| BLOCK 23 | N-CHANNEL | n1 | >0.6 | 0.40 | NO | YES |
| | P-CHANNEL | n2 | >0.6 | -0.40 | NO | YES |
| BLOCK 24 | N-CHANNEL | n3 | <0.3 | 0.40 | YES | NO |
| | P-CHANNEL | n4 | <0.3 | -0.40 | YES | NO |
| BLOCK 25 | N-CHANNEL | n3 | >0.6 | 0.45 | YES | NO(YES) |
| | P-CHANNEL | n4 | >0.6 | -0.45 | YES | NO(YES) |
| BLOCK 26 | N-CHANNEL | n1 | >0.6 | 0.40 | NO | NO |
| | P-CHANNEL | n2 | >0.6 | -0.40 | NO | NO |
| BLOCK 27 | N-CHANNEL | n3 | <0.3 | 0.40 | YES | YES |
| | P-CHANNEL | n4 | <0.3 | -0.40 | YES | YES |
| BLOCK 28 | N-CHANNEL | n3 | >0.6 | 0.45 | YES | YES |
| | P-CHANNEL | n4 | >0.6 | -0.45 | YES | YES |
| BLOCK 29 | N-CHANNEL | n1 | >0.6 | 0.40 | NO | YES |
| | P-CHANNEL | n2 | >0.6 | -0.40 | NO | YES |

FIG. 10

| | | GATE OXIDE FILM | AVERAGE CHANNEL WIDTH ($\mu m$) | AVERAGE THRESHOLD VOLTAGE (V) | POWER SHUTOFF PERFORMED? |
|---|---|---|---|---|---|
| BLOCK 21 | N-CHANNEL | THIN | <0.3 | 0.30 | YES |
| | P-CHANNEL | THIN | <0.3 | -0.35 | YES |
| BLOCK 22 | N-CHANNEL | THIN | >0.6 | 0.40 | YES |
| | P-CHANNEL | THIN | >0.6 | -0.40 | YES |
| BLOCK 23 | N-CHANNEL | THIN | >0.6 | 0.40 | YES |
| | P-CHANNEL | THIN | >0.6 | -0.40 | YES |
| BLOCK 24 | N-CHANNEL | THICK | <0.3 | 0.40 | NO |
| | P-CHANNEL | THICK | <0.3 | -0.40 | NO |
| BLOCK 25 | N-CHANNEL | THIN | >0.6 | 0.40 | NO(YES) |
| | P-CHANNEL | THIN | >0.6 | -0.40 | NO(YES) |
| BLOCK 26 | N-CHANNEL | THIN | >0.6 | 0.40 | NO |
| | P-CHANNEL | THIN | >0.6 | -0.40 | NO |
| BLOCK 27 | N-CHANNEL | THICK | <0.3 | 0.40 | YES |
| | P-CHANNEL | THICK | <0.3 | -0.40 | YES |
| BLOCK 28 | N-CHANNEL | THIN | >0.6 | 0.40 | YES |
| | P-CHANNEL | THIN | >0.6 | -0.40 | YES |
| BLOCK 29 | N-CHANNEL | THIN | >0.6 | 0.40 | YES |
| | P-CHANNEL | THIN | >0.6 | -0.40 | YES |

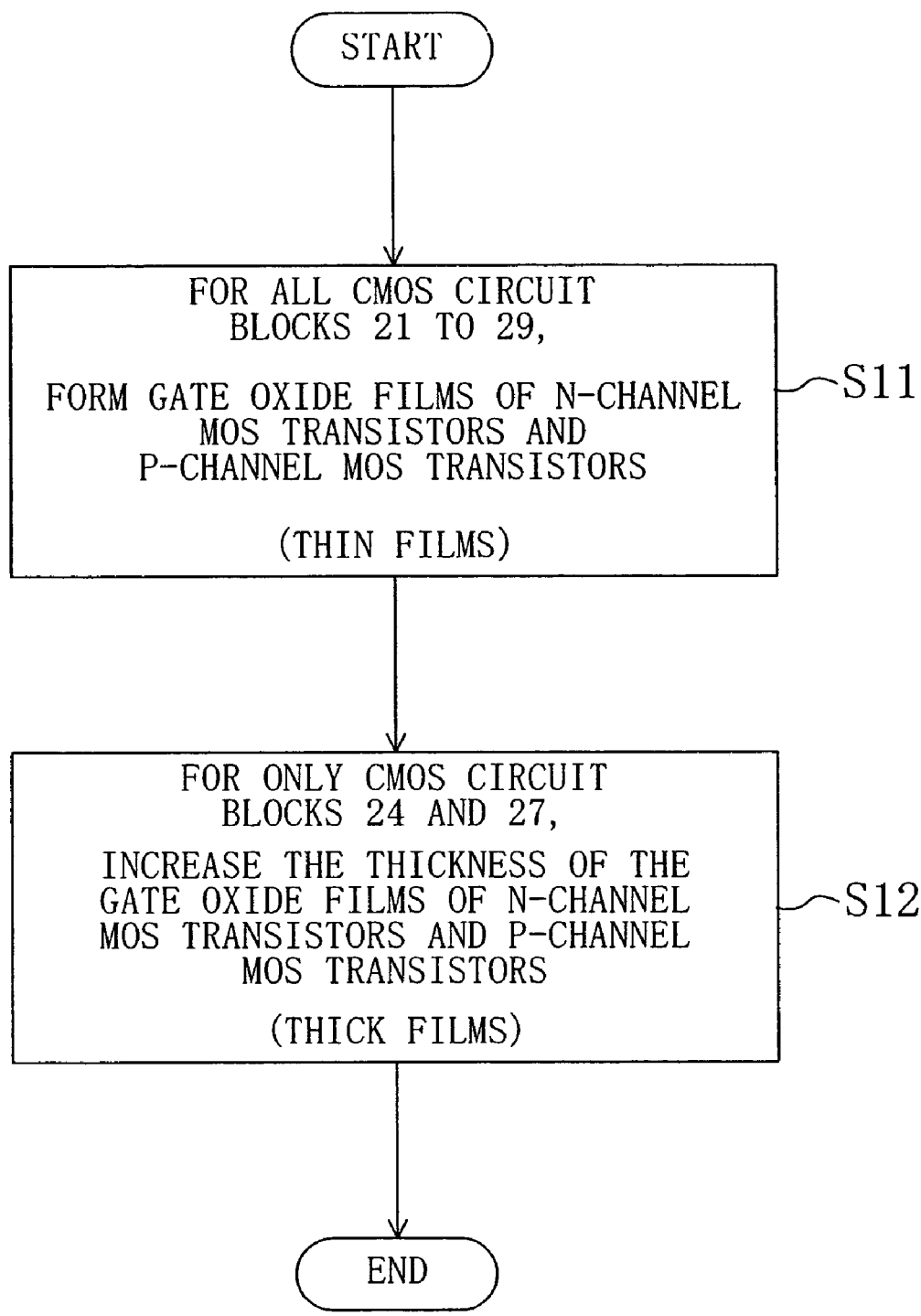

FIG. 13

| | | GATE OXIDE FILM | AVERAGE CHANNEL WIDTH (μm) | AVERAGE THRESHOLD VOLTAGE (V) | POWER SHUTOFF PERFORMED? |
|---|---|---|---|---|---|
| BLOCK 21 | N-CHANNEL | THIN | <0.3 | 0.30 | YES |
| | P-CHANNEL | THIN | <0.3 | -0.35 | YES |
| BLOCK 22 | N-CHANNEL | THIN | >0.6 | 0.40 | YES |
| | P-CHANNEL | THIN | >0.6 | -0.40 | YES |
| BLOCK 23 | N-CHANNEL | THIN | >0.6 | 0.40 | YES |
| | P-CHANNEL | THIN | >0.6 | -0.40 | YES |
| BLOCK 24 | N-CHANNEL | THICK | <0.3 | 0.40 | NO |
| | P-CHANNEL | THIN | <0.3 | -0.35 | NO |
| BLOCK 25 | N-CHANNEL | THIN | >0.6 | 0.40 | NO (YES) |
| | P-CHANNEL | THIN | >0.6 | -0.40 | NO (YES) |
| BLOCK 26 | N-CHANNEL | THIN | >0.6 | 0.40 | NO |
| | P-CHANNEL | THIN | >0.6 | -0.40 | NO |
| BLOCK 27 | N-CHANNEL | THICK | <0.3 | 0.40 | YES |
| | P-CHANNEL | THIN | <0.3 | -0.35 | YES |
| BLOCK 28 | N-CHANNEL | THIN | >0.6 | 0.40 | YES |
| | P-CHANNEL | THIN | >0.6 | -0.40 | YES |
| BLOCK 29 | N-CHANNEL | THIN | >0.6 | 0.40 | YES |
| | P-CHANNEL | THIN | >0.6 | -0.40 | YES |

FIG. 14

| | | GATE OXIDE FILM | AVERAGE CHANNEL WIDTH (μm) | AVERAGE THRESHOLD VOLTAGE (V) | POWER SHUTOFF PERFORMED? |
|---|---|---|---|---|---|
| BLOCK 21 | N-CHANNEL | THIN | <0.3 | 0.30 | YES |
| | P-CHANNEL | THIN | <0.3 | -0.35 | YES |
| BLOCK 22 | N-CHANNEL | THIN | >0.6 | 0.40 | YES |
| | P-CHANNEL | THIN | >0.6 | -0.40 | YES |
| BLOCK 23 | N-CHANNEL | THIN | >0.6 | 0.40 | YES |
| | P-CHANNEL | THIN | >0.6 | -0.40 | YES |
| BLOCK 24 | N-CHANNEL | THICK | <0.3 | 0.40 | NO |
| | P-CHANNEL | THICK | <0.3 | -0.40 | NO |
| BLOCK 25 | N-CHANNEL | THICK | >0.6 | 0.45 | NO (YES) |
| | P-CHANNEL | THICK | >0.6 | -0.45 | NO (YES) |
| BLOCK 26 | N-CHANNEL | THICK | >0.6 | 0.45 | NO |
| | P-CHANNEL | THICK | >0.6 | -0.45 | NO |
| BLOCK 27 | N-CHANNEL | THICK | <0.3 | 0.40 | YES |
| | P-CHANNEL | THICK | <0.3 | -0.40 | YES |
| BLOCK 28 | N-CHANNEL | THICK | >0.6 | 0.45 | YES |
| | P-CHANNEL | THICK | >0.6 | -0.45 | YES |
| BLOCK 29 | N-CHANNEL | THICK | >0.6 | 0.45 | YES |
| | P-CHANNEL | THICK | >0.6 | -0.45 | YES |

FIG. 15

| | | GATE OXIDE FILM | AVERAGE CHANNEL WIDTH (μm) | AVERAGE THRESHOLD VOLTAGE (V) | POWER SHUTOFF PERFORMED? |
|---|---|---|---|---|---|
| BLOCK 21 | N-CHANNEL | THIN | <0.3 | 0.30 | YES |
| | P-CHANNEL | THIN | <0.3 | -0.35 | YES |
| BLOCK 22 | N-CHANNEL | THIN | >0.6 | 0.40 | YES |
| | P-CHANNEL | THIN | >0.6 | -0.40 | YES |
| BLOCK 23 | N-CHANNEL | THIN | >0.6 | 0.40 | YES |
| | P-CHANNEL | THIN | >0.6 | -0.40 | YES |
| BLOCK 24 | N-CHANNEL | THICK | <0.3 | 0.40 | NO |
| | P-CHANNEL | THIN | <0.3 | -0.35 | NO |
| BLOCK 25 | N-CHANNEL | THICK | >0.6 | 0.45 | NO (YES) |
| | P-CHANNEL | THIN | >0.6 | -0.40 | NO (YES) |
| BLOCK 26 | N-CHANNEL | THICK | >0.6 | 0.45 | NO |
| | P-CHANNEL | THIN | >0.6 | -0.40 | YES |
| BLOCK 27 | N-CHANNEL | THICK | <0.3 | 0.40 | YES |
| | P-CHANNEL | THIN | <0.3 | -0.35 | YES |
| BLOCK 28 | N-CHANNEL | THICK | >0.6 | 0.45 | YES |
| | P-CHANNEL | THIN | >0.6 | -0.40 | YES |
| BLOCK 29 | N-CHANNEL | THICK | >0.6 | 0.45 | YES |
| | P-CHANNEL | THIN | >0.6 | -0.40 | YES |

FIG. 16

| | | GATE OXIDE FILM | AVERAGE CHANNEL WIDTH (μm) | AVERAGE THRESHOLD VOLTAGE (V) | POWER SHUTOFF PERFORMED? |
|---|---|---|---|---|---|
| BLOCK 21 | N-CHANNEL | THIN | <0.3 | 0.30 | YES |
| | P-CHANNEL | THIN | <0.3 | -0.35 | YES |
| BLOCK 22 | N-CHANNEL | THIN | >0.6 | 0.40 | YES |
| | P-CHANNEL | THIN | >0.6 | -0.40 | YES |
| BLOCK 23 | N-CHANNEL | THIN | >0.6 | 0.40 | YES |
| | P-CHANNEL | THIN | >0.6 | -0.40 | YES |
| BLOCK 24 | N-CHANNEL | THICK | <0.3 | 0.40 | NO |
| | P-CHANNEL | THICK | <0.3 | -0.40 | NO |
| BLOCK 25 | N-CHANNEL | THICK | >0.6 | 0.45 | NO(YES) |
| | P-CHANNEL | THICK | >0.6 | -0.45 | NO(YES) |
| BLOCK 26 | N-CHANNEL | THIN | >0.6 | 0.40 | NO |
| | P-CHANNEL | THIN | >0.6 | -0.40 | NO |
| BLOCK 27 | N-CHANNEL | THICK | <0.3 | 0.40 | YES |
| | P-CHANNEL | THICK | <0.3 | -0.40 | YES |
| BLOCK 28 | N-CHANNEL | THICK | >0.6 | 0.45 | YES |
| | P-CHANNEL | THICK | >0.6 | -0.45 | YES |
| BLOCK 29 | N-CHANNEL | THIN | >0.6 | 0.40 | YES |
| | P-CHANNEL | THIN | >0.6 | -0.40 | YES |

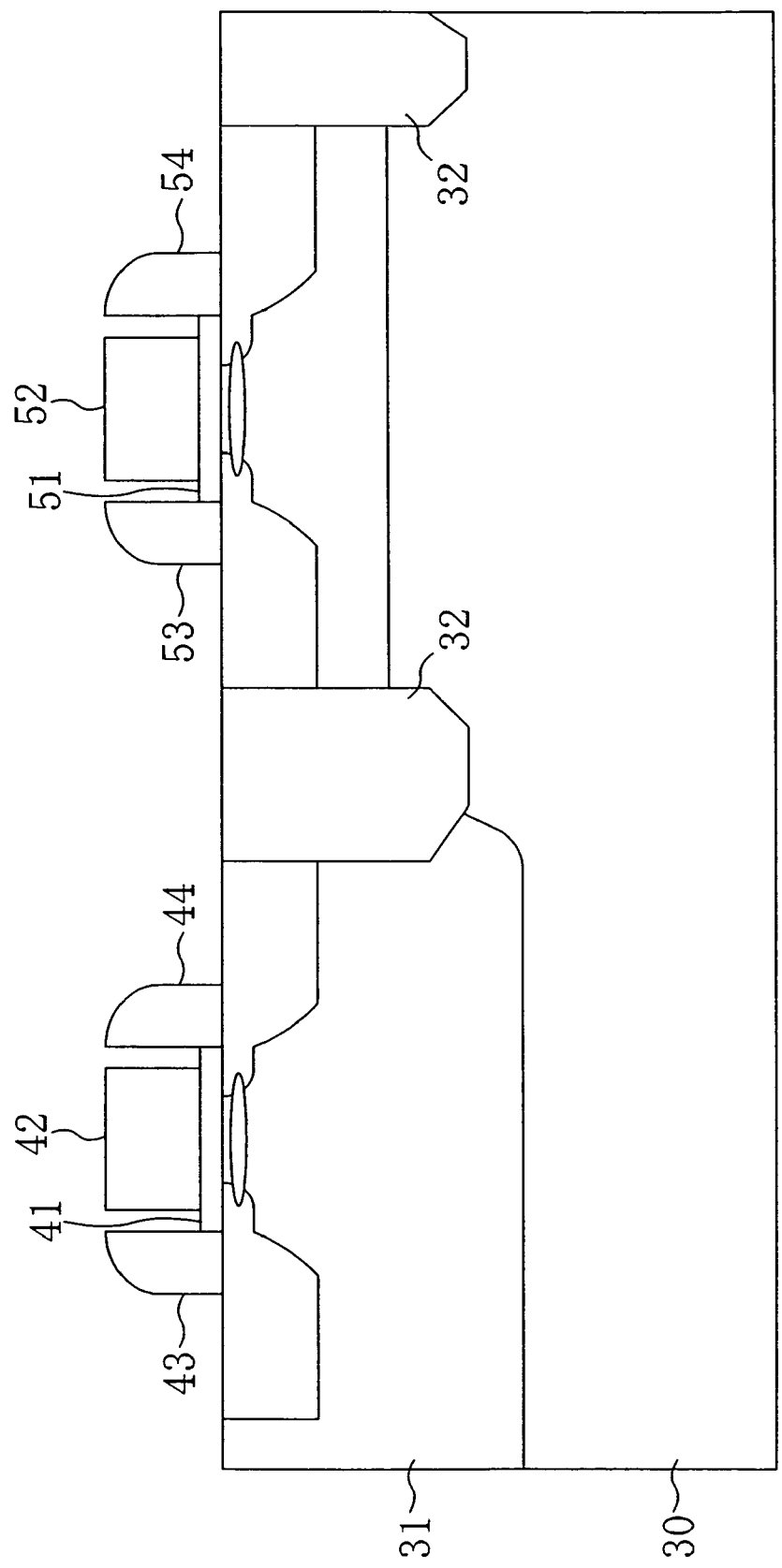

HORIZONTAL 2-BIT CELL

VERTICAL 2-BIT CELL

SEMICONDUCTOR INTEGRATED CIRCUIT AND METHOD FOR FABRICATING THE SAME

This application is a divisional of application Ser. No. 10/445,807, now U.S. Pat. No. 6,770,940, filed May 28, 2003.

BACKGROUND OF THE INVENTION

The present invention relates to a semiconductor integrated circuit of a CMOS structure including a plurality of static random access memories (SRAMs) and a plurality of logic circuits respectively accessing these SRAMs, and a method for fabricating the same.

A recent system LSI developed for portable equipment such as cellular phones includes a digital signal processor (DSP) required to perform high-speed processing of voice and moving image data and a central processing unit (CPU) responsible for processing of applications and system control during standby. A high-speed SRAM is necessary for the DSP as a buffer memory for transmit/receive data. Also, a SRAM is necessary for the DSP to be used as a work memory.

In conventional system LSIs for portable equipment, the threshold voltage (Vt) of MOS transistors tends to be set comparatively high for reduction of leakage current during standby. In such system LSIs, also, it is required to maintain the speed of the DSP and the CPU. Therefore, tight transistor design and circuit design are conventionally made in the tradeoff between the speed and the leakage current. In reality, processes specified for portable equipment, including increasing the threshold voltage slightly and increasing the gate length of MOS transistors slightly for avoiding a variation in leakage current, have been developed, separately from standard processes for non-portable equipment.

With the connection of portable equipment such as cellular phones to the Internet, the data processing amount of the portable equipment has sharply increased. In addition, the capacity of a memory for buffering data of moving images and data from the Internet has also increased.

In the situation described above, increase in leakage current due to the increased memory capacity has arisen concurrently with the request for high-speed operation of the DSP and the CPU. For solving these problems, the level of optimizing the transistor design and the circuit design as described above is no more useful.

The problem of reducing the leakage current may be solved by shutting off the power to circuits inside the LSI. However, since portable equipment, which is connected to a wireless network, has processing to be processed during standby, it is no more possible to simply shut off the power.

In the future, in mounting a number of circuit blocks having different uses on one chip, if fabrication processes optimized for the respective circuit blocks are individually adopted, the entire fabrication process will be complicated and thus the fabrication cost will increase.

SUMMARY OF THE INVENTION

An object of the present invention is providing a semiconductor integrated circuit in which a plurality of circuit blocks satisfying different performance requirements can be formed on one chip without complicating the fabrication process.

The present invention is applicable to a semiconductor integrated circuit of a CMOS structure including a first SRAM cell array required to operate at high speed and a second SRAM cell array operating at a speed lower than the speed of the first SRAM cell array. Power to the first SRAM cell array is shut off as required. For example, it is shut off during standby. Power to the second SRAM cell array is kept supplied even during the shutoff of power to the first SRAM cell array, for retention of data. Accordingly, the degree of necessity of leakage reduction during standby is low in the first SRAM cell array but high in the second SRAM cell array. In view of the above, according to the present invention, as for at least either N-channel MOS transistors or P-channel MOS transistors, MOS transistors of low Vt (threshold voltage of a transistor) are adopted for the first SRAM cell array for high-speed operation, and MOS transistors of high Vt are adopted for the second SRAM cell array for leakage reduction. For this adoption, first, the average channel width of MOS transistors constituting each of the first and second SRAM cell arrays is set at a half or less of the average channel width of MOS transistors constituting each of the other circuit blocks (for example, SRAM peripheral circuits and logic circuits), to thereby enable use of a "reverse narrow channel characteristic" (characteristic that the absolute value of Vt is smaller as the channel width is smaller) for the first and second SRAM cell arrays in which a high scale of integration is required. In addition, the channel impurity concentration of the MOS transistors of the second SRAM cell array is set higher than the channel impurity concentration of the MOS transistors of the first SRAM cell array by additional ion implantation. By this additional ion implantation, the decreased absolute value of Vt of the MOS transistors of the second SRAM cell array due to the reverse narrow channel effect is compensated, to provide MOS transistors of high Vt. The "high Vt" as used herein refers to that the absolute value of the threshold voltage of a MOS transistor, N-channel or P-channel, is large.

In place of the additional ion implantation, the thickness of a gate oxide film may be adjusted. More specifically, gate oxide films of the MOS transistors of the second SRAM cell array are set thicker than gate oxide films of the MOS transistors of the first cell array by film thickness adjustment. By this film thickness adjustment, also, the decreased absolute value of Vt of the MOS transistors of the second SRAM cell array due to the reverse narrow channel effect is compensated, to provide MOS transistors of high Vt.

A third SRAM cell array, which operates at a speed lower than that of the first SRAM cell array, as does the second SRAM cell array, and has a memory capacity larger than the second SRAM cell array, may be provided. In this case, even if the third SRAM cell array is formed under the high Vt transistor conditions as is the second SRAM cell array to reduce the leakage current per memory cell, the total leakage current flowing in all the memory cells of the third SRAM cell array during the operation of the third SRAM cell array will be too large to be negligible. According to the present invention, therefore, the third SRAM cell array, in which no data retention is required, is powered off as required.

As described above, according to the present invention, the reverse narrow channel characteristic of MOS transistors is used, the additional ion implantation for adjusting the channel impurity concentration or the adjustment of the thickness of the gate oxide film is adopted, and, low Vt or high Vt MOS transistors are selectively used for the respective circuit blocks depending on the operating speed and depending on whether or not power is shut off. In this way, a plurality of circuit blocks satisfying different performance requirements can be mounted on one chip without complicating the fabrication process.

BRIEF DESCRIPTION OF THE DRAWINGS

FIG. 1 is a block diagram of an internal configuration of a semiconductor integrated circuit of the present invention.

FIGS. 2A, 2B and 2C are circuit diagrams respectively showing a partial circuit configuration of first, second and third SRAM cell arrays in FIG. 1, a partial configuration of first, second and third peripheral circuits in FIG. 1, and a partial circuit configuration of first, second and third logic circuits in FIG. 1.

FIG. 3 is a view showing requirements of the first, second and third SRAMs in FIG. 1.

FIG. 4 is a view showing a first example of transistor characteristics of nine circuit blocks in FIG. 1.

FIG. 6 is a view showing a second example of transistor characteristics of the nine circuit blocks in FIG. 1.

FIG. 7 is a view showing a third example of transistor characteristics of the nine circuit blocks in FIG. 1.

FIG. 8 is a view showing a fourth example of transistor characteristics of the nine circuit blocks in FIG. 1.

FIG. 9 is a view showing a fifth example of transistor characteristics of the nine circuit blocks in FIG. 1.

FIG. 10 is a view showing a sixth example of transistor characteristics of the nine circuit blocks in FIG. 1.

FIG. 11 is a flowchart of a gate oxide film formation process related to the transistor characteristics of FIG. 10.

FIG. 13 is a view showing a seventh example of transistor characteristics of the nine circuit blocks in FIG. 1.

FIG. 14 is a view showing an eighth example of transistor characteristics of the nine circuit blocks in FIG. 1.

FIG. 15 is a view showing a ninth example of transistor characteristics of the nine circuit blocks in FIG. 1.

FIG. 16 is a view showing a tenth example of transistor characteristics of the nine circuit blocks in FIG. 1.

FIG. 20 is a cross-sectional view of an N-channel MOS transistor and a P-channel MOS transistor of the semiconductor integrated circuit of FIG. 1.

DESCRIPTION OF THE PREFERRED EMBODIMENTS

Figure 5:
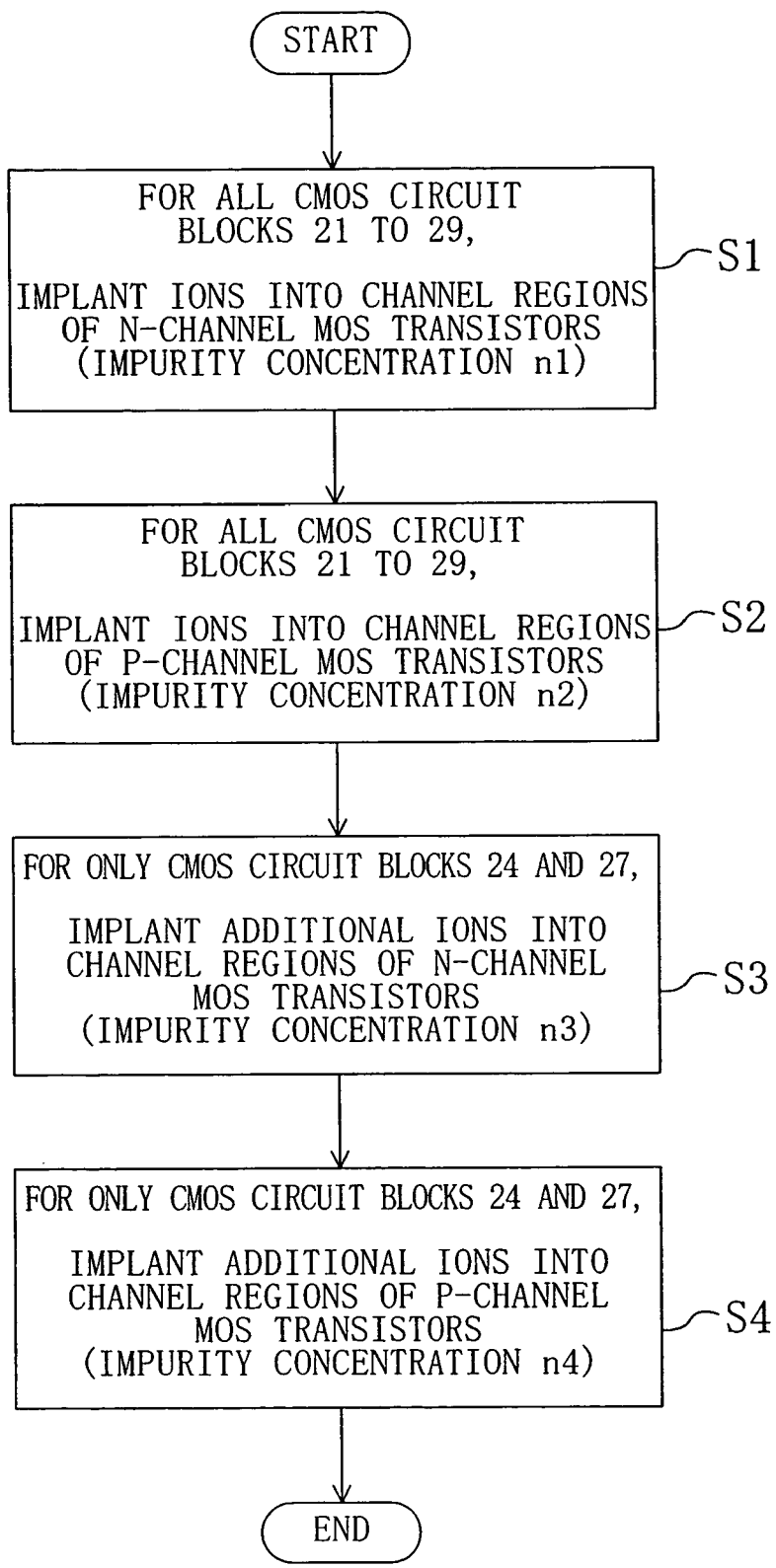
FIG. 5 is a flowchart of an ion implantation process related to the transistor characteristics of FIG. 4.

FIG. 1 shows an internal configuration of a semiconductor integrated circuit of the present invention. A semiconductor integrated circuit 10 of FIG. 1 is a CMOS system LSI for cellular phones, for example. The semiconductor integrated circuit 10 includes a first region 11 in which power is shut off during standby and a second region 12 in which power is kept supplied. The first region 11 includes a first SRAM cell array 21, a first peripheral circuit 22 and a first logic circuit 23. The first peripheral circuit 22, which is a circuit for mediating access to the first SRAM cell array 21, includes an address decoder, a sense amplifier and the like. The first SRAM cell array 21 and the first peripheral circuit 22 constitute a first SRAM. The first logic circuit 23 is a DSP responsible for high-speed baseband processing of voice and moving image data, and accesses the first SRAM serving as a buffer memory for transmit/receive data.

The second region 12 includes a second SRAM cell array 24, a second peripheral circuit 25 and a second logic circuit 26. The second peripheral circuit 25, which is a circuit for mediating access to the second SRAM cell array 24, includes an address decoder, a sense amplifier and the like. The second SRAM cell array 24 and the second peripheral circuit 25 constitute a second SRAM. The second logic circuit 26 is a CPU responsible for processing of applications and system control during standby, and accesses the second SRAM serving as a work memory.

The first region 11 further includes a third SRAM cell array 27, a third peripheral circuit 28 and a third logic circuit 29. The third peripheral circuit 28, which is a circuit for mediating access to the third SRAM cell array 27, includes an address decoder, a sense amplifier and the like. The third SRAM cell array 27 and the third peripheral circuit 28 constitute a third SRAM. The third logic circuit 29 is an image processing unit (IPU) responsible for compression/decompression of moving image data, and accesses the third SRAM serving as a buffer memory for image frames.

FIG. 2A shows a partial circuit configuration of the first, second and third SRAM cell arrays 21, 24 and 27 in FIG. 1. FIG. 2B shows a partial configuration of the first, second and third peripheral circuits 22, 25 and 28 in FIG. 1. FIG. 2C shows a partial circuit configuration of the first, second and third logic circuits 23, 26 and 29 in FIG. 1. FIG. 2A represents a single memory cell of a 6-transistor structure, in which BL and /BL denote bit lines, WL a word line, MN0 and MN1 N-channel MOS transistors serving as drive transistors, MN2 and MN3 N-channel MOS transistors serving as access transistors, MP0 and MP1 P-channel MOS transistors serving as load transistors, Vcc a power supply, and Vss the ground. FIG. 2B represents a CMOS address decoder, in which Ai-1, Ai and Ai+1 denote address bits. FIG. 2C represents a single CMOS flipflop, in which Din denotes input data, Dout output data, and CLK a clock.

FIG. 3 shows the requirements of the first, second and third SRAMs in FIG. 1. The first SRAM composed of the first SRAM cell array 21 and the first peripheral circuit 22 is a high-speed SRAM operating at a frequency of 250 MHz and has a memory capacity of 100 Kbits. In the first SRAM, to which power is shut off during standby, the leakage reduction requirement is small both during operation and during standby. The second SRAM composed of the second SRAM cell array 24 and the second peripheral circuit 25 is an intermediate-speed SRAM operating at a frequency of 100 MHz and has a memory capacity of 100 Kbits. In the second SRAM, which must retain data, the leakage reduction requirement is small during operation but is large during standby because power is kept supplied. The third SRAM composed of the third SRAM cell array 27 and the third peripheral circuit 28 is a low-speed SRAM operating at a frequency of 33 Mhz and has a memory capacity exceeding 500 Kbits. In the third SRAM, to which power is shut off during standby, the leakage reduction requirement is small during standby but is large during operation because the memory capacity is large.

FIG. 4 shows a first example of transistor characteristics of the nine circuit blocks 21 to 29 in FIG. 1. Referring to FIG. 4, the average channel width of N-channel MOS transistors and P-channel MOS transistors constituting each of the first to third SRAM cell arrays 21, 24, 27, for which a high scale of integration is required, is set at a half or less of the average channel width (for example, more than 0.6 µm) of N-channel MOS transistors and P-channel MOS transistors constituting each of the other circuit blocks 22, 23, 25, 26, 28 and 29, that is, set at 0.25 µm, for example, to enable use of the reverse narrow channel characteristic.

In addition, the channel impurity concentration (n3) of the N-channel transistors of the second and third SRAM cell arrays 24 and 27 is set to be higher than the channel impurity concentration (n1) of the other circuit blocks 21, 22, 23, 25. 26, 28 and 29 by additional ion implantation. Likewise, the channel impurity concentration (n4) of the P-channel transistors of the second and third SRAM cell arrays 24 and 27 is set to be higher than the channel impurity concentration (n2) of the other circuit blocks 21, 22, 23, 25. 26, 28 and 29 by additional ion implantation.

As a result, the N-channel MOS transistors of the first SRAM cell array 21 have Vt lower than the N-channel MOS transistors of the other circuit blocks 22 to 29, and the P-channel MOS transistors of the first SRAM cell array 21 have Vt lower (smaller in absolute vlaue) than the P-channel MOS transistors of the other circuit blocks 22 to 29. In this way, while the first SRAM cell array 21 composed of MOS transistors of low Vt permits high-speed operation, the second and third SRAM cell arrays 24 and 27 each composed of MOS transistors of high Vt permits leakage reduction. Note that the address decoder and the sense amplifier constituting the second peripheral circuit 25 may be powered off during standby as long as no trouble arises. As for the second logic circuit (CPU) 26, which includes a flipflop, power is kept supplied to prevent data held in the flipflop from being destroyed, as in the second SRAM cell array 24.

The additional ion implantation may be performed only for the drive transistors MN0 and MN1 and the load transistors MP0 and MP1 in FIG. 2A. That is, the channel impurity concentration may be selectively set high only for the drive transistors MN0 and MN1 and the load transistors MP0 and MP1 of the second and third SRAM cell arrays 24 and 27. As for the access transistors MN2 and MN3, the leakage current can be suppressed by controlling the potential of the ground Vss or by controlling so that the potential of the word lines WL is negative.

FIG. 5 is a flowchart of an ion implantation process related to the transistor characteristics of FIG. 4. Before the start of the process shown in FIG. 5, the average channel width of the N-channel MOS transistors and the P-channel MOS transistors constituting each of the first to third SRAM cell arrays 21, 24, 27 is set at a half or less of the average channel width of the N-channel MOS transistors and the P-channel MOS transistors constituting each of the other circuit blocks 22, 23, 25, 26, 28 and 29, as described above. Thereafter, in step S1 in FIG. 5, ions are implanted into the channel regions of the N-channel MOS transistors of all the circuit blocks 21 to 29, to obtain an average channel impurity concentration n1. In step S2, ions are implanted into the channel regions of the P-channel MOS transistors of all the circuit blocks 21 to 29, to obtain an average channel impurity concentration n2. In step S3, additional ions are implanted into the channel regions of the N-channel MOS transistors of only the circuit blocks 24 and 27, to obtain a channel impurity concentration n3 higher than n1. In step S4, additional ions are implanted into the channel regions of the P-channel MOS transistors of only the circuit blocks 24 and 27, to obtain a channel impurity concentration n4 higher than n2.

FIG. 6 shows a second example of transistor characteristics of the nine circuit blocks 21 to 29 in FIG. 1. In the example shown in FIG. 6, unlike the example in FIG. 4, additional ions are not implanted into the P-channel MOS transistors of the second and third SRAM cell arrays 24 and 27. That is, the P-channel MOS transistors of all the circuit blocks 21 to 29 have a uniform channel impurity concentration (n2). The reason why the additional ion implantation for increase of Vt is performed only for the N-channel MOS transistors is that the reverse narrow channel effect is greater in the N-channel MOS transistors than in the P-channel transistors. This can omit the step S4 from the flowchart of FIG. 5, and thus provides the effect of reducing the number of steps of the ion implantation.

FIG. 7 shows a third example of transistor characteristics of the nine circuit blocks 21 to 29 shown in FIG. 1. In the example shown in FIG. 7, unlike the example in FIG. 4, the additional ion implantation is performed for all of the circuit blocks 24 to 29. That is, the channel impurity concentration (n3) of the N-channel MOS transistors of the second and third SRAM cell arrays 24 and 27, the second and third peripheral circuits 25 and 28, and the second and third logic circuits 26 and 29 is set higher than the channel impurity concentration (n1) of the N-channel MOS transistors of the other circuit blocks 21, 22 and 23 by the additional ion implantation. Likewise, the channel impurity concentration (n4) of the P-channel MOS transistors of the second and third SRAM cell arrays 24 and 27, the second and third peripheral circuits 25 and 28, and the second and third logic circuits 26 and 29 is set higher than the channel impurity concentration (n2) of the P-channel MOS transistors of the other circuit blocks 21, 22 and 23 by the additional ion implantation. As a result, since each of the second and third SRAM cell arrays 24 and 27, the second and third peripheral circuits 25 and 28, and the second and third logic circuits 26 and 29 is essentially composed of MOS transistors of high Vt, leakage reduction is attained.

FIG. 8 shows a fourth example of transistor characteristics of the nine circuit blocks 21 to 29 in FIG. 1. In the example shown in FIG. 8, unlike the example in FIG. 7, the additional ion implantation is not performed for the P-channel MOS transistors of the second and third SRAM cell arrays 24 and 27, the second and third peripheral circuits 25 and 28, and the second and third logic circuits 26 and 29.

That is, the P-channel MOS transistors of all the circuit blocks 21 to 29 have a uniform channel impurity concentration (n2). This provides the effect of reducing the number of steps of the ion implantation, as in the example in FIG. 6.

FIG. 9 shows a fifth example of transistor characteristics of the nine circuit blocks 21 to 29 in FIG. 1. In the example shown in FIG. 9, unlike the example in FIG. 7, the additional ion implantation is performed only for the circuit blocks 24, 25, 27 and 28. That is, the channel impurity concentration (n3) of the N-channel MOS transistors of the second and third SRAM cell arrays 24 and 27 and the second and third peripheral circuits 25 and 28 is set higher than the channel impurity concentration (n1) of the N-channel MOS transistors of the other circuit blocks 21, 22, 23, 26 and 29. Likewise, the channel impurity concentration (n4) of the P-channel MOS transistors of the second and third SRAM cell arrays 24 and 27 and the second and third peripheral circuits 25 and 28 is set higher than the channel impurity concentration (n2) of the P-channel MOS transistors of the other circuit blocks 21, 22, 23, 26 and 29. As a result, since each of the second and third SRAM cell arrays 24 and 27 and the second and third peripheral circuits 25 and 28 is essentially composed of MOS transistors of high Vt, leakage reduction is attained. Note that in this example, also, the additional ion implantation may not be performed for the P-channel MOS transistors.

FIG. 10 shows a sixth example of transistor characteristics of the nine circuit blocks 21 to 29 in FIG. 1. In the example shown in FIG. 10, the average channel width of the N-channel MOS transistors and the P-channel MOS transistors constituting each of the first to third SRAM cell arrays 21, 24 and 27, for which a high scale of integration is required, is set at a half or less of the average channel width (for example, more than 0.6 μm) of the N-channel MOS transistors and the P-channel MOS transistors constituting each of the other circuit blocks 22, 23, 25, 26, 28 and 29, that is, set at 0.25 μm, for example, to enable use of the reverse narrow channel characteristic.

In addition, the gate oxide film of each of the N-channel MOS transistors of the second and third SRAM cell arrays 24 and 27 is set to be thicker than the gate oxide film of each of the N-channel MOS transistors of the other circuit blocks 21, 22, 23, 25, 26, 28 and 29. Likewise, the gate oxide film of each of the P-channel MOS transistors of the second and third SRAM cell arrays 24 and 27 is set to be thicker than the gate oxide film of each of the P-channel MOS transistors of the other circuit blocks 21, 22, 23, 25, 26, 28 and 29.

As a result, the N-channel MOS transistors of the first SRAM cell array 21 have Vt lower than the N-channel MOS transistors of the other circuit blocks 22 to 29, and the P-channel MOS transistors of the first SRAM cell array 21 have Vt lower (smaller in absolute value) than the P-channel MOS transistors of the other circuit blocks 22 to 29. In this way, while the first SRAM cell array 21 composed of MOS transistors of low Vt permits high-speed operation, the second and third SRAM cell arrays 24 and 27 each composed of MOS transistors of high Vt permits leakage reduction. Note that the address decoder and the sense amplifier constituting the second peripheral circuit 25 may be powered off during standby as long as no trouble arises. As for the second logic circuit (CPU) 26, which includes a flipflop, power is kept supplied to prevent data held in the flipflop from being destroyed, as in the second SRAM cell array 24.

The increase of the film thickness may be performed only for the drive transistors MN0 and MN1 and the load transistors MP0 and MP1 in FIG. 2A. That is, the gate oxide film may be selectively set thick only for the drive transistors MN0 and MN1 and the load transistors MP0 and MP1 of the second and third SRAM cell arrays 24 and 27. As for the access transistors MN2 and MN3, the leakage current can be suppressed by controlling the potential of the ground Vss or by controlling so that the potential of the word lines WL is negative.

FIG. 11 is a flowchart of a gate oxide film formation process related to the transistor characteristics of FIG. 10. Before the start of the process shown in FIG. 11, the average channel width of the N-channel MOS transistors and the P-channel MOS transistors constituting each of the first to third SRAM cell arrays 21, 24, 27 is set at a half or less of the average channel width of the N-channel MOS transistors and the P-channel MOS transistors constituting each of the other circuit blocks 22, 23, 25, 26, 28 and 29, as described above. Thereafter, in step S11 shown in FIG. 11, a thin gate oxide film is formed for each of the N-channel MOS transistors and the P-channel MOS transistors of all the circuit blocks 21 to 29. In step S12, film thickness adjustment is performed, in which the gate oxide film of each of the N-channel MOS transistors and the P-channel MOS transistors of only the circuit blocks 24 and 27 is increased to obtain a thick film.

Figure 12:
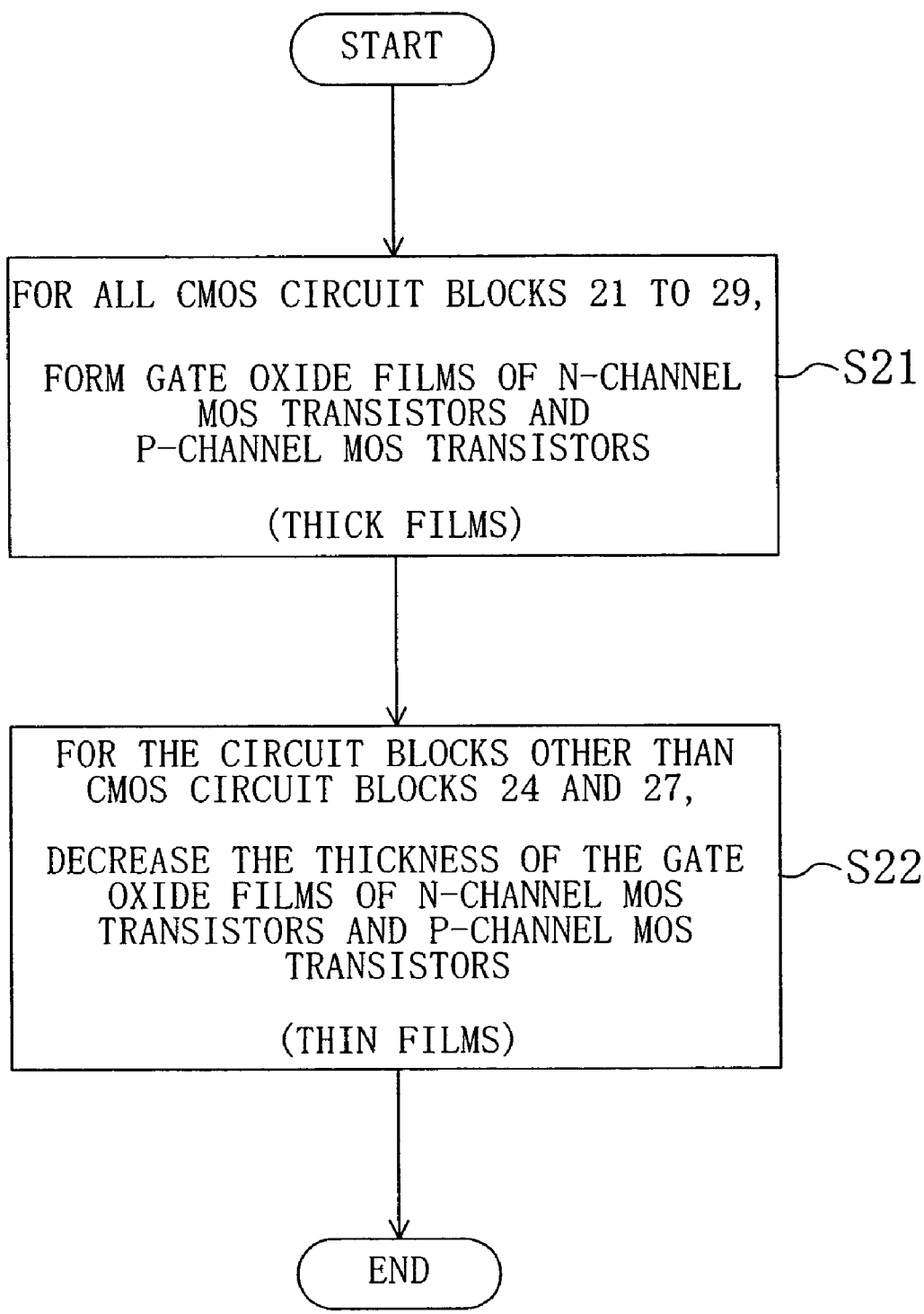
FIG. 12 is another flowchart of the gate oxide film formation process related to the transistor characteristics of FIG. 10.

FIG. 12 is another flowchart of the gate oxide film formation process related to the transistor characteristics of FIG. 10. Before the start of the process shown in FIG. 12, the average channel width of the N-channel MOS transistors and the P-channel MOS transistors constituting each of the first to third SRAM cell arrays 21, 24, 27 is set at a half or less of the average channel width of the N-channel MOS transistors and the P-channel MOS transistors constituting each of the other circuit blocks 22, 23, 25, 26, 28 and 29, as described above. Thereafter, in step S21 shown in FIG. 12, a thick gate oxide film is formed for each of the N-channel MOS transistors and the P-channel MOS transistors of all the circuit blocks 21 to 29. In step S22, film thickness adjustment is performed, in which the gate oxide film of each of the N-channel MOS transistors and the P-channel MOS transistors of the circuit blocks other than the circuit blocks 24 and 27 is reduced to obtain a thin film.

FIG. 13 shows a seventh example of transistor characteristics of the nine circuit blocks 21 to 29 shown in FIG. 1. In the example shown in FIG. 13, unlike the example in FIG. 10, the film thickness adjustment is not performed for the P-channel MOS transistors of the second and third SRAM cell arrays 24 and 27. That is, the gate oxide films of the P-channel MOS transistors of all the circuit blocks 21 to 29 have a uniform thickness. The reason why the film thickness adjustment for increase of Vt is performed only for the N-channel MOS transistors is that the reverse narrow channel effect is greater in the N-channel transistors than in the P-channel transistors.

FIG. 14 shows an eighth example of transistor characteristics of the nine circuit blocks 21 to 29 shown in FIG. 1. In the example shown in FIG. 14, unlike the example in FIG. 10, the film thickness adjustment is performed for all of the circuit blocks 24 to 29. That is, the gate oxide film of each of the N-channel MOS transistors of the second and third SRAM cell arrays 24 and 27, the second and third peripheral circuits 25 and 28, and the second and third logic circuits 26 and 29 is set thicker than the gate oxide film of each of the N-channel MOS transistors of the other circuit blocks 21, 22 and 23 by the film thickness adjustment. Likewise, the gate oxide film of the P-channel MOS transistors of each of the second and third SRAM cell arrays 24 and 27, the second and third peripheral circuits 25 and 28, and the second and third logic circuits 26 and 29 is set thicker than the gate oxide film of each of the P-channel MOS transistors of each of the other circuit blocks 21, 22 and 23. As a result, since each of the second and third SRAM cell arrays 24 and 27, the second and third peripheral circuits 25 and 28, and the second and third logic circuits 26 and 29 is essentially composed of MOS transistors of high Vt, leakage reduction is attained. Note that no problem of leakage increase due to the thin gate oxide film will arise for the first SRAM cell array 21, the first peripheral circuit 22 and the first logic circuit 23 because these circuits are powered off during standby.

FIG. 15 shows a ninth example of transistor characteristics of the nine circuit blocks 21 to 29 shown in FIG. 1. In the example shown in FIG. 15, unlike the example in FIG. 14, the film thickness adjustment is not performed for the P-channel MOS transistors of the second and third SRAM cell arrays 24 and 27, the second and third peripheral circuits 25 and 28, and the second and third logic circuits 26 and 29. That is, the gate oxide films of the P-channel MOS transistors of all the circuit blocks 21 to 29 have a uniform thickness.

FIG. 16 shows a tenth example of transistor characteristics of the nine circuit blocks 21 to 29 in FIG. 1. In the example shown in FIG. 16, unlike the example in FIG. 14, the film thickness adjustment is performed only for the circuit blocks 24, 25, 27 and 28. That is, the gate oxide film of each of the N-channel MOS transistors of the second and third SRAM cell arrays 24 and 27 and the second and third peripheral circuits 25 and 28 is set thicker than the gate oxide film of each of the N-channel MOS transistors of the other circuit blocks 21, 22, 23, 26 and 29 by the film thickness adjustment. Likewise, the gate oxide film of each of the P-channel MOS transistors of the second and third SRAM cell arrays 24 and 27 and the second and third peripheral circuits 25 and 28 is set thicker than the gate oxide film of each of the P-channel MOS transistors of the other circuit blocks 21, 22, 23, 26 and 29 by the film thickness adjustment. As a result, since each of the second and third SRAM cell arrays 24 and 27 and the second and third peripheral circuits 25 and 28 is composed of MOS transistors of high Vt, leakage reduction is attained. Note that in this example, also, the film formation adjustment may not be performed for the P-channel MOS transistors.

Hereinafter, the reverse narrow characteristic and the additional ion implantation mentioned above will be described concretely in detail.

Figure 17:
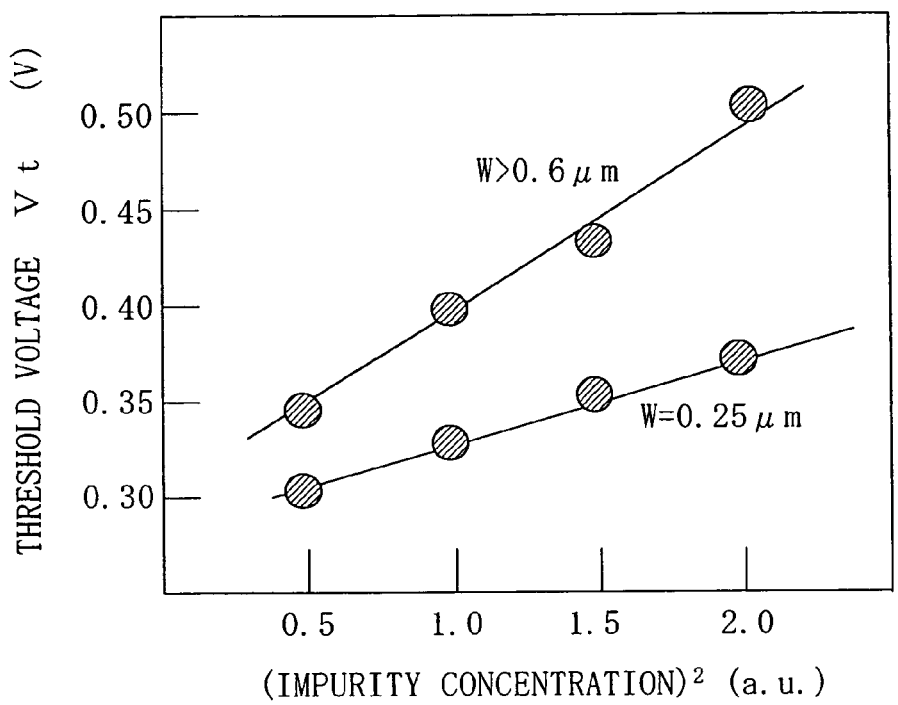
FIG. 17 is a view showing the relationship between the channel impurity concentration and the threshold voltage with the channel width as a parameter in N-channel MOS transistors.

FIG. 17 shows the relationship between the channel impurity concentration and the threshold voltage Vt with the channel width W used as a parameter in N-channel MOS transistors. When the channel width W is constant, Vt is roughly proportional to the square of the channel impurity concentration. In addition, the factor of the proportionality when W=0.25 μm is smaller than that when W>0.60 μm.

Figure 18:
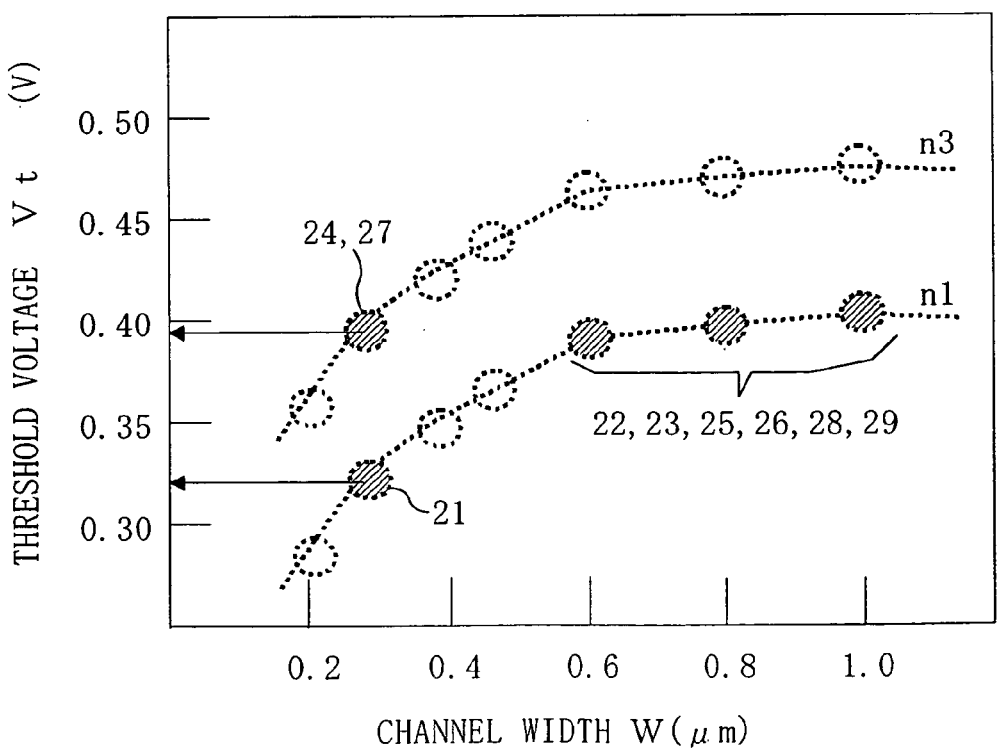
FIG. 18 is a view showing the relationship between the channel width and the threshold voltage with the channel impurity concentration as a parameter in N-channel MOS transistors.

FIG. 18 shows the relationship between the channel width W and the threshold voltage Vt with the channel impurity concentration used as a parameter in N-channel MOS transistors. The black circles in FIG. 18 correspond to the respective transistor characteristics shown in FIG. 4. When the channel impurity concentration is the constant value n1, the reverse narrow channel characteristic is exhibited, in which Vt is lower as the channel width W is smaller. Therefore, the N-channel MOS transistors of the first SRAM cell array 21 have Vt lower than the N-channel MOS transistors of the circuit blocks 22, 23, 25, 26, 28 and 29. In other words, the level of Vt can be controlled by changing the channel width W even when the channel impurity concentration is the same. The N-channel transistors of the second and third SRAM cell arrays 24 and 27 have roughly the same level of Vt as the N-channel MOS transistors of the circuit blocks 22, 23, 25, 26, 28 and 29 because the channel impurity concentration is n3 increased by the additional ion implantation. As a result, the N-channel MOS transistors of the first SRAM cell array 21 have the lowest threshold voltage Vt.

Figure 19:
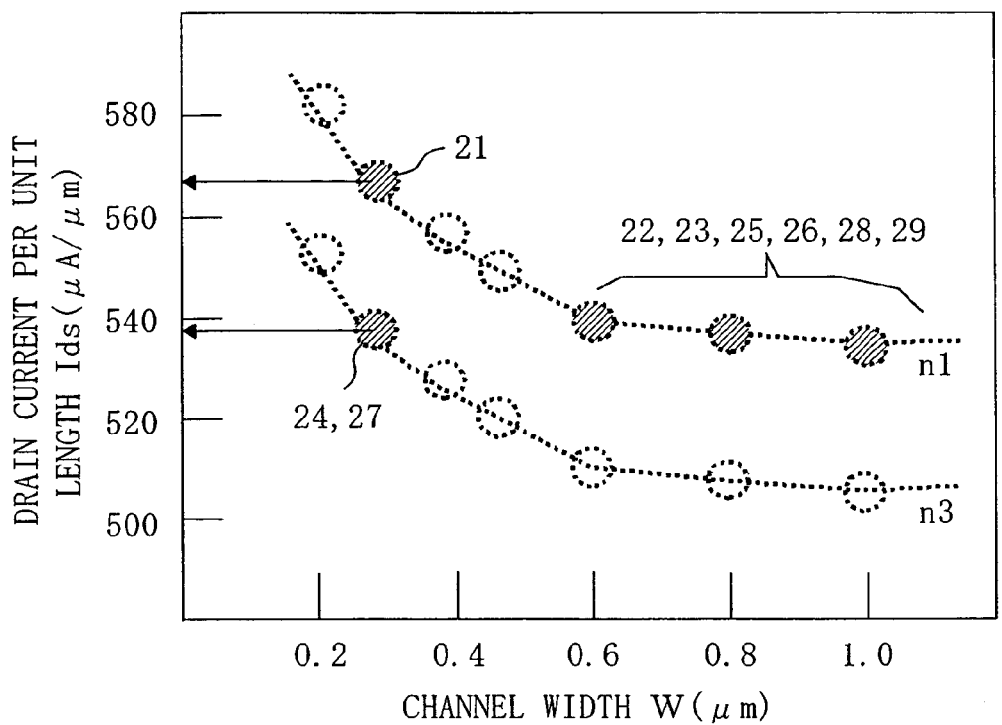
FIG. 19 is a view showing the relationship between the channel width and the drain current per unit length with the channel impurity concentration as a parameter in N-channel MOS transistors.

FIG. 19 shows the relationship between the channel width W and the drain current Ids per unit length with the channel impurity concentration used as a parameter in N-channel MOS transistors. As shown in FIG. 19, the current Ids, which directly affects the cell current, is largest in the N-channel MOS transistors of the first SRAM cell array 21. This indicates that N-channel MOS transistors having the highest drive capability can be provided for the first SRAM cell array 21 in the fabrication process in which N-channel MOS transistors for the circuit blocks 22, 23, 25, 26, 28 and 29 are also provided.

The level of the threshold voltage Vt can also be controlled with the thickness of the gate oxide film. The threshold voltage Vt increases with increase of the thickness of the gate oxide film, and hence leakage reduction is attained.

Hereinafter, selection of the gate width of the MOS transistors will be described.

Figure 21:
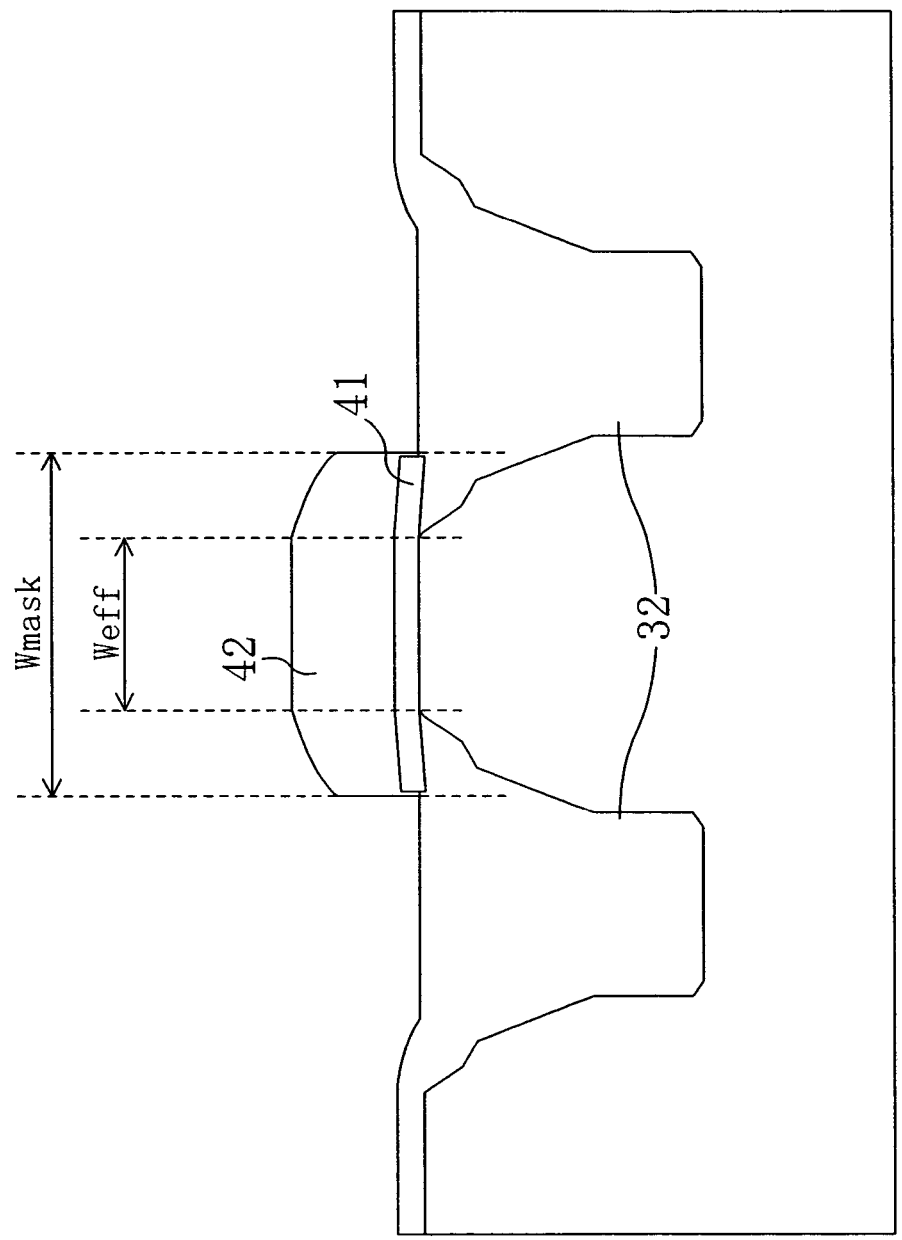
FIG. 21 is a cross-sectional view of the N-channel MOS transistor in FIG. 20 taken in the gate width direction.

FIG. 20 is a cross-sectional view of an N-channel MOS transistor and a P-channel MOS transistor of the semiconductor integrated circuit 10 of FIG. 1. In FIG. 20, the left part represents a region of the N-channel MOS transistor and the right part represents a region of the P-channel MOS transistor. FIG. 21 is a cross-sectional view of the N-channel MOS transistor in FIG. 20 in the gate width direction. Referring to FIGS. 20 and 21, the reference numeral 30 denotes a p-type semiconductor substrate, 31 an n-well, 32 isolation regions, 41 and 51 gate oxide films, 42 and 52 gate electrodes, 43 and 53 source electrodes, and 44 and 54 drain electrodes. As shown in FIG. 21, in the transistor of which the channel width is considerably small, the effective channel width Weff is smaller than the mask width Wmask.

Figure 22:
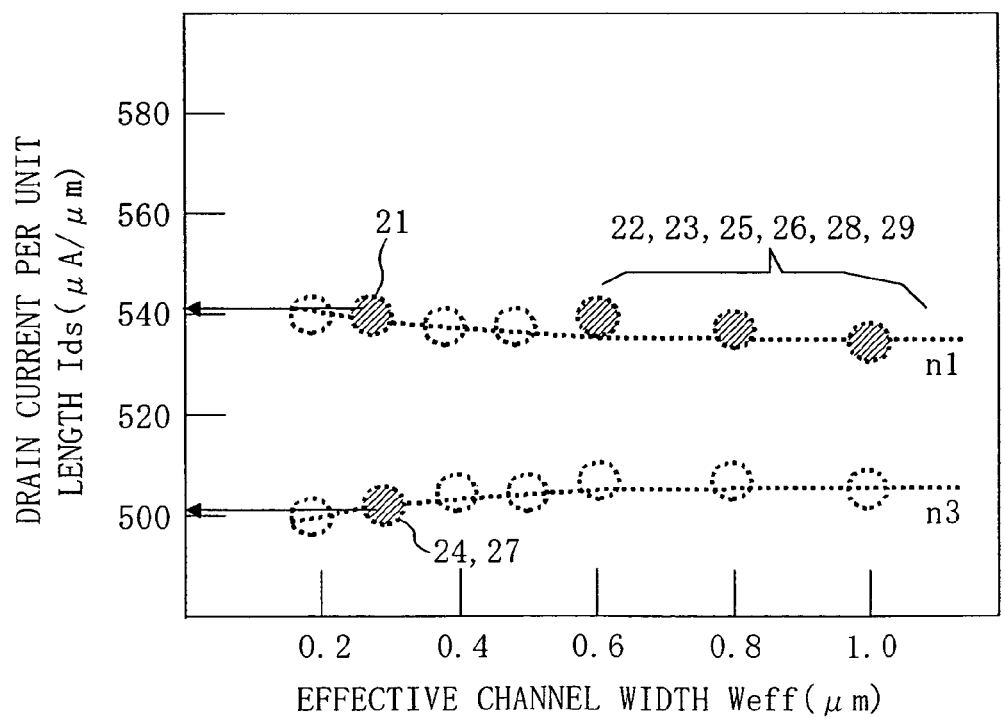
FIG. 22 is a view showing the relationship between the effective channel width and the drain current per unit length with the channel impurity concentration as a parameter in N-channel MOS transistors having a considerably small channel width.

FIG. 22 shows the relationship between the effective channel width Weff and the drain current Ids per unit length with the channel impurity concentration using as a parameter in N-channel MOS transistors of which the channel width is considerably small. As is found from comparison of FIG. 22 with FIG. 19, the current Ids decreases when Weff is smaller than Wmask. If this decrease fails to be minimized, the current Ids of the N-channel MOS transistors of the first SRAM cell array 21 will rather decrease in spite of the decrease of the threshold voltage Vt thereof attained by the reverse narrow channel characteristic.

As Wmask is smaller, the transistor characteristics at the boundary of the N-channel MOS transistor with the isolation region 32 shown in FIG. 21 become more influential. If the threshold voltage Vt of the transistor at the boundary with the isolation region 32 is low, the entire threshold voltage Vt will be low due to this influence. The transistor characteristics at the isolation region 32 depend on the injection to a sidewall during formation of the isolation region 32 and the shape of the isolation region 32 that influences the electric field distribution. In particular, the shape of the isolation region 32 influences the electric field distribution at the boundary with the isolation region 32 located right below the gate electrode 42, and hence influences the threshold voltage Vt. In consideration of these, the impurity concentration distribution should be determined so that the reverse narrow channel characteristic shown in FIG. 18 is exhibited, by controlling the shape of the isolation region 32, the injection to the sidewall thereof, and the shape of the oxide film embedded in the isolation region 32 right below the gate electrode 42.

Finally, the layout of the first, second and third SRAM cell arrays 21, 24 and 27 will be described. The first SRAM cell array 21 adopts a horizontal memory cell structure in which the bit line length per memory cell is shorter than the word line length per memory cell. The second and third SRAM cell arrays 24 and 27 adopt a vertical memory cell structure in which the bit line length per memory cell is longer than the word line length per memory cell.

Figure 23:
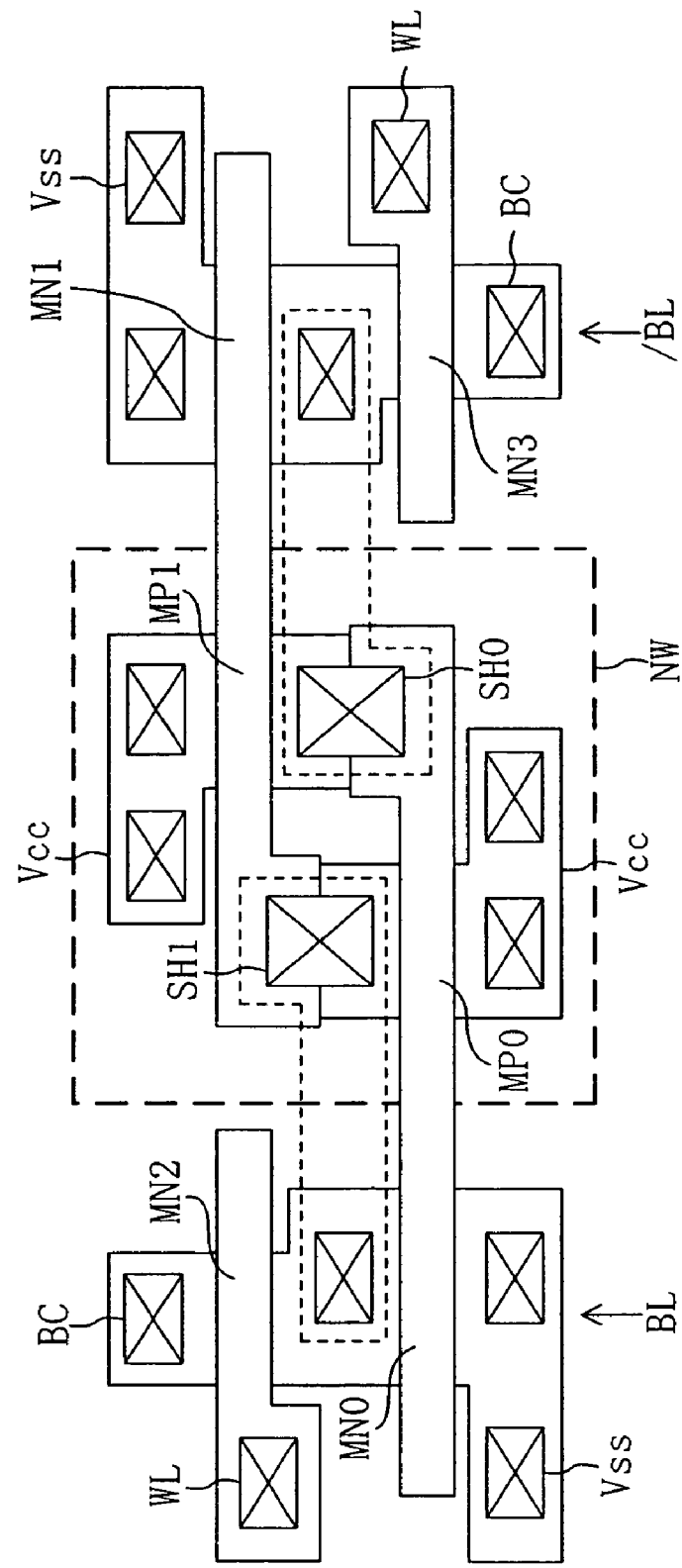
FIG. 23 is a plan view showing an exemplary layout of the first SRAM cell array in FIG. 1.

FIG. 23 shows a horizontal memory cell of the first SRAM cell array 21 in FIG. 1, in which BL and /BL denote bit lines, WL a word line, MN0 and MN1 N-channel MOS transistors serving as drive transistors, MN2 and MN3 N-channel MOS transistors serving as access transistors, MP0 and MP1 P-channel MOS transistors serving as load transistors, NW an n-well, BC bit line contacts, and SH0 and SH1 shared contacts. The two P-channel transistors MP0 and MP1 are placed inside the n-well NW, the two N-channel MOS transistors MN0 and NM2 are placed in a region on the left side of the n-well NW, and the two N-channel MOS transistors MN1 and NM3 are placed in a region on the right side of the n-well NW.

Figure 24:
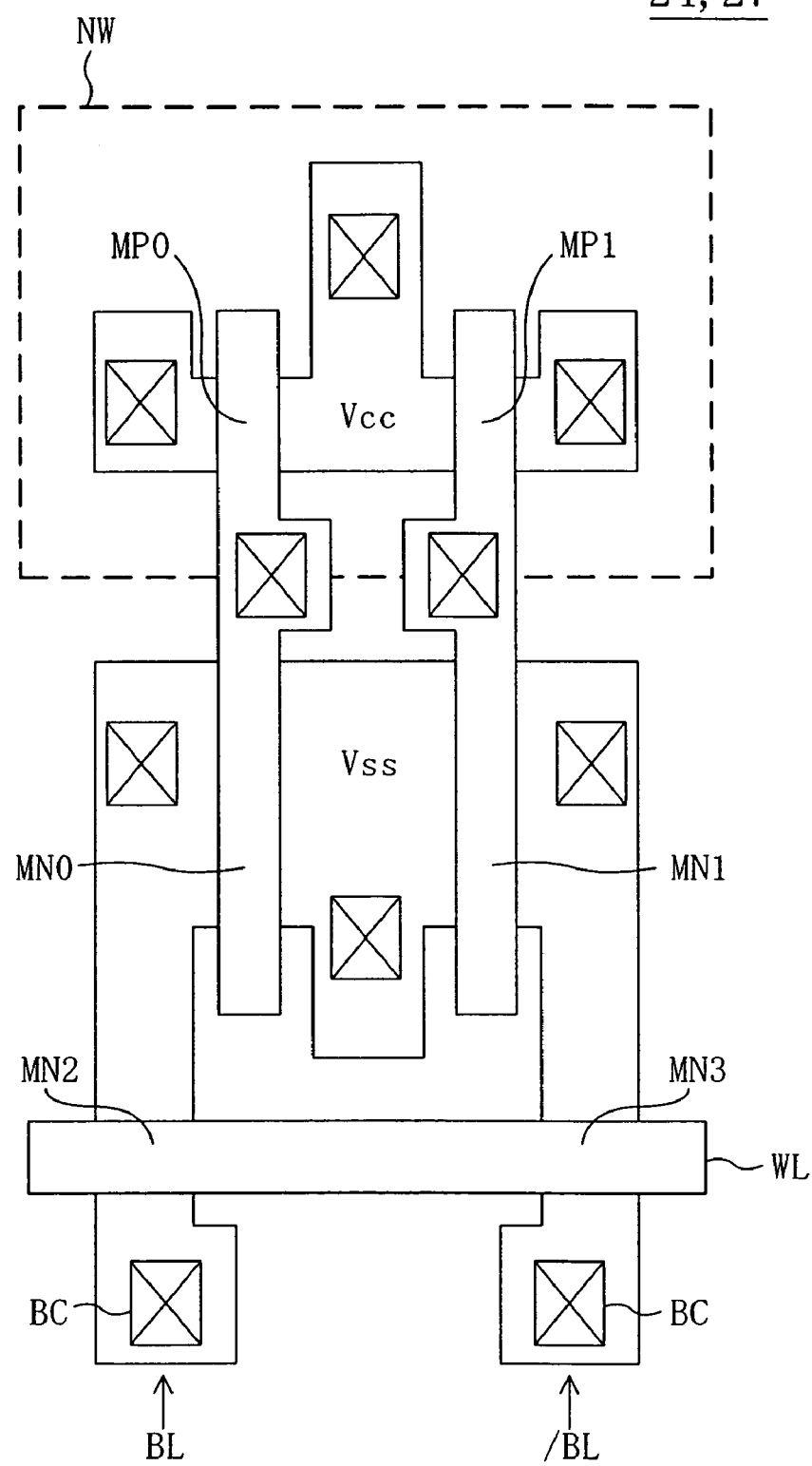
FIG. 24 is a plan view showing an exemplary layout of the second and third SRAM cell arrays in FIG. 1.

FIG. 24 shows a vertical memory cell of the second and third SRAM cell arrays 24 and 27 in FIG. 1, in which BL and /BL denote bit lines, WL a word line, MN0 and MN1 N-channel MOS transistors serving as drive transistors, MN2 and MN3 N-channel MOS transistors serving as access transistors, MP0 and MP1 P-channel MOS transistors serving as load transistors, NW an n-well, and BC bit line contacts. The two P-channel transistors MP0 and MP1 are placed inside the n-well NW, and the four N-channel MOS transistors MN0, MN1, MN2 and MN3 are placed in a region on the lower side of the n-well NW.

Figure 25A:
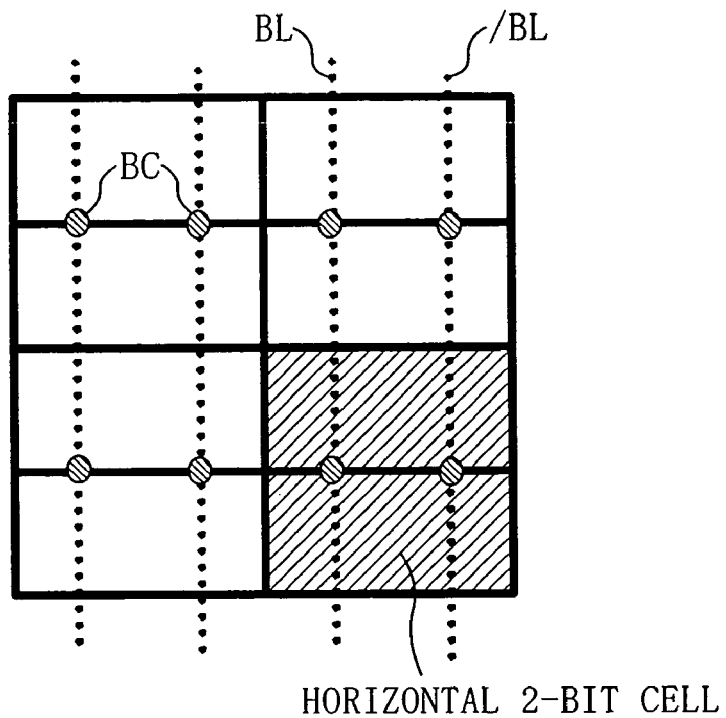
FIGS. 25A and 25B are conceptual views showing bit line arrangements for the horizontal memory cell in FIG. 23 and the vertical memory cell in FIG. 24, respectively.
Figure 25B:
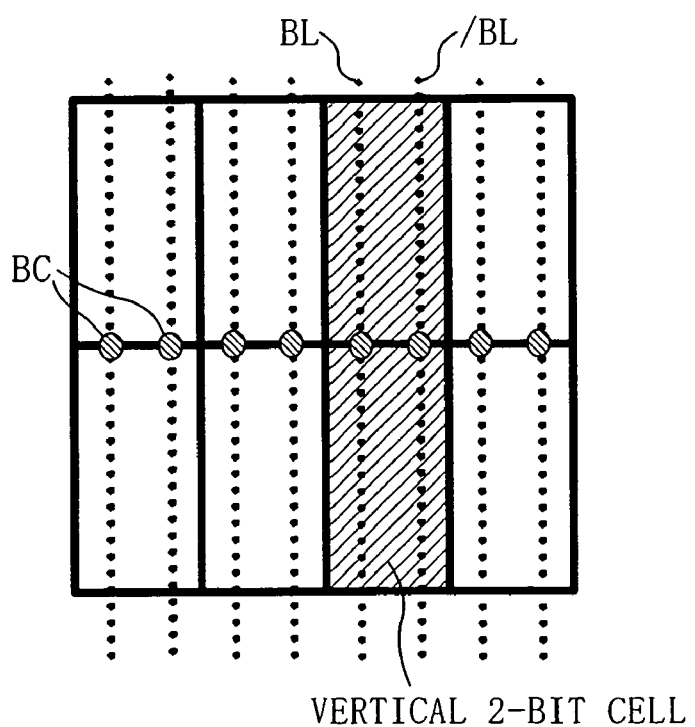

FIGS. 25A and 25B show the bit line arrangements for the horizontal memory cell of FIG. 23 and the vertical memory cell of FIG. 24, respectively. In the horizontal memory cell shown in FIG. 25A, the channel width of the drive transistors MN0 and MN1 can be made smaller compared with that in the vertical memory cell shown in FIG. 25B, for the following two reasons. The first reason is that the bit line capacitance per memory cell is smaller in the horizontal memory cell. This is because the bit line per memory cell itself is short and the distance between the adjacent bit lines is large. The second reason is that the potential difference between the bit line pair is more likely to be large in the horizontal memory cell. This is because a shield line such as a power supply line is laid out between the bit lines and this reduces destruction of data due to coupling of the adjacent bit lines. For these reasons, in the horizontal memory cell, no large cell current is necessary to discharge the bit lines, and this permits reduction of the channel width of the drive transistors MN0 and MN1 that determines the cell current.

Figure 26:
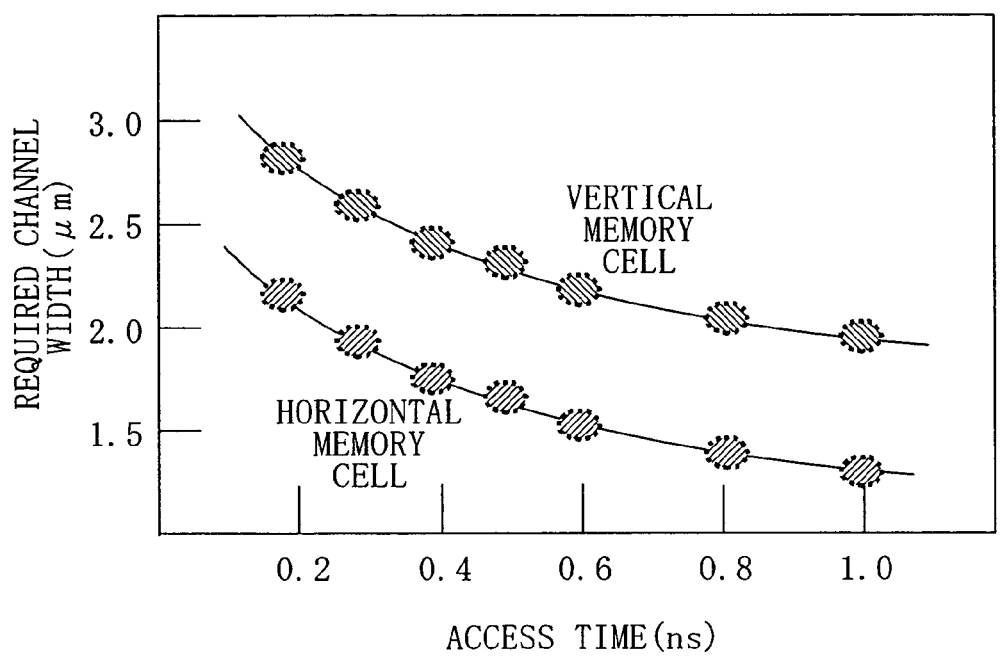
FIG. 26 is a view showing the relationship between the access time and the channel width required for MOS transistors in each of the horizontal memory cell in FIG. 23 and the vertical memory cell in FIG. 24.

FIG. 26 shows the relationship between the access time and the channel width required for MOS transistors for the horizontal memory cell in FIG. 23 and the vertical memory cell in FIG. 24. It is found from FIG. 26 that in the horizontal memory cell, the channel width can be smaller to attain the same access time and therefore a low threshold voltage Vt can be obtained more easily than in the vertical memory cell. It is therefore concluded that the horizontal memory cell can be conveniently used for the first SRAM cell array 21 in which leakage current is allowable and high priority is given to speedup, and that the vertical memory cell can be conveniently used for the second and third SRAM cell arrays 24 and 27 in which leakage current must be suppressed.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A method for fabricating a semiconductor integrated circuit of a CMOS structure comprising: a first static random access memory (SRAM) operating at a first frequency, power to the first SRAM being shut off as required; a first logic circuit accessing the first SRAM; a second SRAM operating at a second frequency lower than the first frequency, power to the second SRAM being kept supplied during the shutoff of power to the first SRAM; and a second logic circuit accessing the second SRAM, the first SRAM including a first SRAM cell array and a first peripheral circuit for mediating access to the first SRAM cell array, the second SRAM including a second SRAM cell array and a second peripheral circuit for mediating access to the second SRAM cell array, the method comprising the steps of:

setting the average channel width of MOS transistors constituting each of the first and second SRAM cell arrays at a half or less of the average channel width of MOS transistors constituting each of the first and second peripheral circuits and the first and second logic circuits;

performing ion implantation so that the MOS transistors of the first and second SRAM cell arrays, the first peripheral circuit and the first logic circuit have a uniform channel impurity concentration; and performing additional ion implantation for channel regions of the MOS transistors of the second SRAM cell array so that the channel impurity concentration of the MOS transistors of the second SRAM cell array is higher than the channel impurity concentration of the MOS transistors of the first SRAM cell array, the first peripheral circuit and the first logic circuit, to thereby allow the MOS transistors of the first SRAM cell array to have a threshold voltage lower than the MOS transistors of the second SRAM cell array as for at least either N-channel MOS transistors or P-channel MOS transistors.

2. A method for fabricating a semiconductor integrated circuit of a CMOS structure comprising: a first static random access memory (SRAM) operating at a first frequency, power to the first SRAM being shut off as required; a first logic circuit accessing the first SRAM; a second SRAM operating at a second frequency lower than the first frequency, power to the second SRAM being kept supplied during the shutoff of power to the first SRAM; and a second logic circuit accessing the second SRAM, the first SRAM including a first SRAM cell array and a first peripheral circuit for mediating access to the first SRAM cell array, the second SRAM including a second SRAM cell array and a second peripheral circuit for mediating access to the second SRAM cell array, the method comprising the steps of:

setting the average channel width of MOS transistors constituting each of the first and second SRAM cell arrays at a half or less of the average channel width of MOS transistors constituting each of the first and second peripheral circuits and the first and second logic circuits;

performing film formation so that gate oxide films of the MOS transistors of the first and second SRAM cell arrays, the first peripheral circuit and the first logic circuit have a uniform thickness; and performing film thickness adjustment so that the gate oxide films of the MOS transistors of the second SRAM cell array are thicker than the gate oxide films of the MOS transistors of the first SRAM cell array, the first peripheral circuit and the first logic circuit, to thereby allow the MOS transistors of the first SRAM cell array to have a threshold voltage lower than the MOS transistors of the second SRAM cell array as for at least either N-channel MOS transistors or P-channel MOS transistors.

* * * * *